US007058757B1

(12) United States Patent
Branth et al.

(10) Patent No.: US 7,058,757 B1
(45) Date of Patent: Jun. 6, 2006

(54) CONTENT ADDRESSABLE MEMORY (CAM) DEVICES THAT SUPPORT DISTRIBUTED CAM CONTROL AND METHODS OF OPERATING SAME

(75) Inventors: Kenneth Branth, Redwood City, CA (US); Jakob Saxtorph, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 429 days.

(21) Appl. No.: 10/620,161

(22) Filed: Jul. 15, 2003

(51) Int. Cl.
*G06F 12/06* (2006.01)
*G06F 12/00* (2006.01)

(52) U.S. Cl. ........................... 711/108; 711/149
(58) Field of Classification Search ............. 711/108, 711/149

See application file for complete search history.

(56) References Cited

U.S. PATENT DOCUMENTS

| 6,148,364 | A   | 11/2000 | Srinivasan et al. ....... 711/108 |
|-----------|-----|---------|----------------------------------|
| 6,219,748 | B1  | 4/2001  | Srinivasan et al. ....... 711/108 |
| 6,240,485 | B1  | 5/2001  | Srinivasan et al. ....... 711/108 |
| 6,374,326 | B1  | 4/2002  | Kansal et al. |
| 6,526,474 | B1  | 2/2003  | Ross |
| 6,763,426 | B1  | 7/2004  | James et al. .............. 711/108 |
| 6,876,558 | B1* | 4/2005  | James et al. ................ 365/49 |
| 6,892,272 | B1* | 5/2005  | Srinivasan et al. ....... 711/108 |
| 2004/0001380 | A1* | 1/2004 | Becca et al. .............. 365/202 |
| 2004/0088476 | A1* | 5/2004 | Abdat ....................... 711/108 |

OTHER PUBLICATIONS

Moors, et al., "Cascasding Content-Addressable Memories", © 1992 IEEE, p. 56-66.*
CommsDesign, LA-1: Examining the Look-Aside Processor Interface, http://www.commsdesign.com/story/OEG20030520S0008, May 20, 2003, 6 pages.

* cited by examiner

*Primary Examiner*—Brian R. Peugh
(74) *Attorney, Agent, or Firm*—Myers Bigel Sibley & Sajovec PA (57) ABSTRACT

Content addressable memory (CAM) devices include CAM logic that is configured to pass an instruction received at an instruction input port to an instruction output port without inspection or alteration. This enables the CAM devices to be operated as equivalent devices within a cascaded chain of CAM devices that collectively form multiple databases within a lookup engine having distributed CAM control. This CAM logic may include an input instruction register that is configured to latch the instruction received at the instruction input port and an output instruction register that is configured to latch the instruction received from the input instruction register. This CAM logic may also include an instruction FIFO that is configured to buffer instructions received from the input instruction register. A method of performing a learn operation in a cascaded chain of CAM devices may include writing a search key associated with a database into a selected one of the cascaded chain of CAM devices, in response to evaluating whether an NFA table in the selected one of the cascaded chain of CAM devices has a valid NFA address for the search key. Then, following the write operation, an operation may be performed to search each of the CAM devices in the cascaded chain to identify an address of a highest priority invalid entry in a CAM device that retains at least a portion of the database.

23 Claims, 6 Drawing Sheets

| DATABASE | VALID BIT | NEXT FREE ADDRESS |
|---|---|---|
| DB1 | V1 | NFA 1 |
| DB2 | V2 | NFA 2 |
| DB3 | V3 | NFA 3 |
| DB4 | V4 | NFA 4 |
| DB5 | V5 | NFA 5 |
| DB6 | V6 | NFA 6 |
| DB7 | V7 | NFA 7 |
| DB8 | V8 | NFA 8 |
| DB9 | V9 | NFA 9 |
| DB10 | V10 | NFA 10 |
| DB11 | V11 | NFA 11 |
| DB12 | V12 | NFA 12 |
| DB13 | V13 | NFA 13 |
| DB14 | V14 | NFA 14 |
| DB15 | V15 | NFA 15 |
| DB16 | V16 | NFA 16 |

NFA TABLE

CONTENT ADDRESSABLE MEMORY (CAM) DEVICES THAT SUPPORT DISTRIBUTED CAM CONTROL AND METHODS OF OPERATING SAME

FIELD OF THE INVENTION

The present invention relates to integrated circuit memory devices and methods of operating same, and more particularly to content addressable memory devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. Upon completion of the search operation, the identified location(s) containing the equivalent data is typically encoded to provide an address (e.g., CAM array block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706, 224, 5,852,569 and 5,964,857 to Srinivasan et al. and in U.S. Pat. Nos. 6,101,116, 6,256,216, 6,128,207 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a search operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

Figure 1:
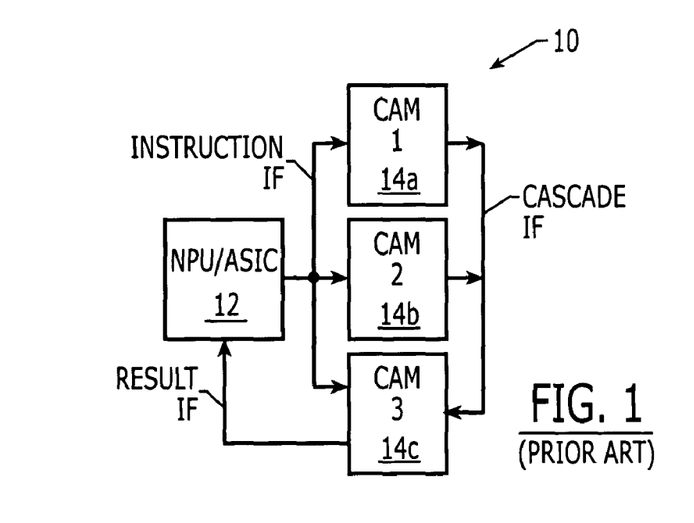
FIG. 1 is a block diagram of a conventional integrated circuit system that utilizes a parallel arrangement of CAM devices, which are connected to a network processing unit (NPU) or application specific integrated circuit (ASIC).

A plurality of CAM devices may be configured to operate as a lookup engine that is responsive to instructions generated by a network processing unit (NPU) or other application specific integrated circuit (ASIC). FIG. 1 illustrates a conventional integrated circuit system 10 that utilizes a parallel arrangement of CAM devices 14$a$–14$c$ and an NPU/ASIC device 12 to perform the functions of a lookup engine. In this system 10, all CAM devices receive instructions from the NPU 12 at the same time and the results generated by the CAM devices are passed to the last CAM device (CAM 3), which returns a result to the NPU 12. The system 10 includes three primary buses: INSTRUCTION IF (instruction interface bus), CASCADE IF (cascade interface bus) and RESULT IF (result interface bus). The performance of the system of FIG. 1 may be limited by the interface degradation that is typically present when a relatively large number of CAM devices are all loading from the same interface bus (e.g., INSTRUCTION IF).

Figure 2A:
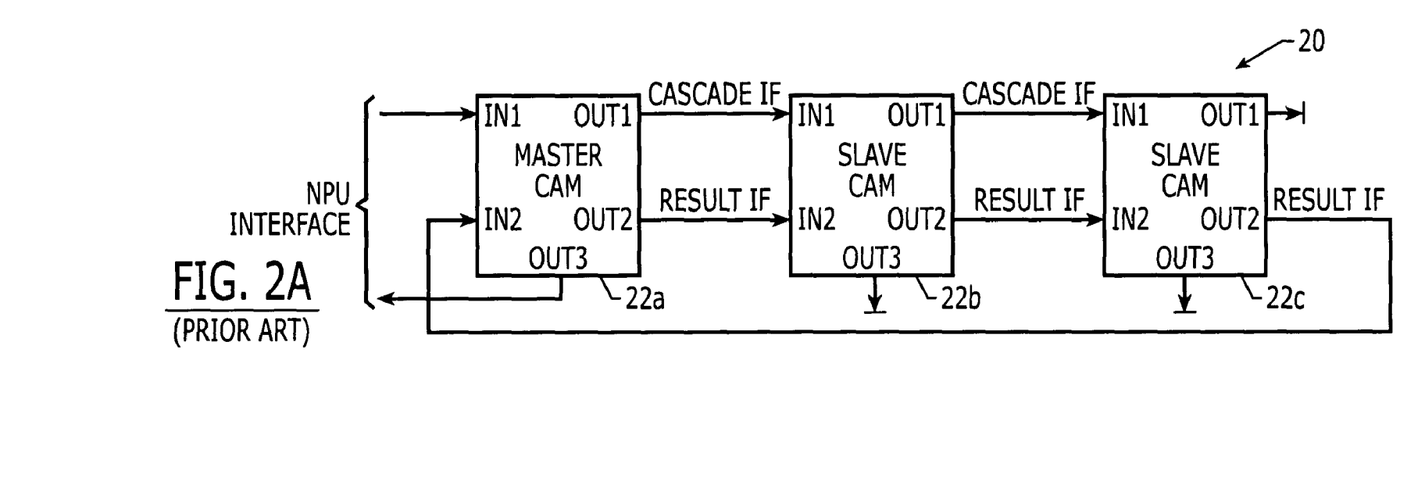
FIG. 2A is a block diagram of a conventional integrated circuit system that utilizes a cascaded arrangement of master and slave CAM devices as a lookup engine.
Figure 2B:
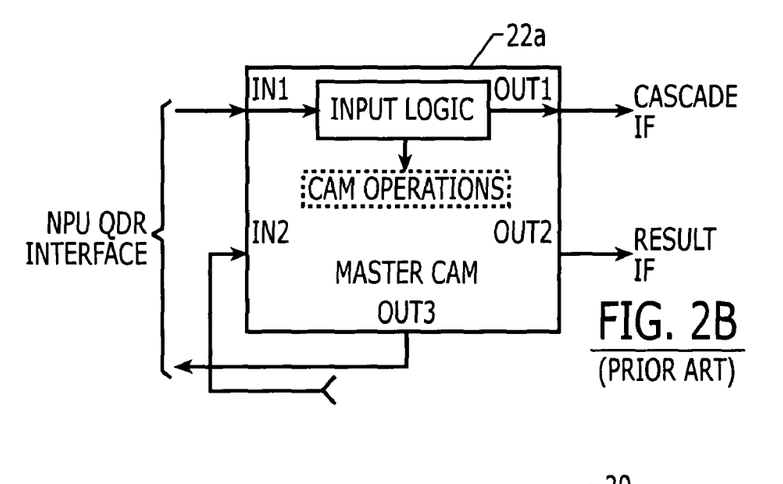
FIG. 2B is a block diagram of a master CAM device used in the system of FIG. 2A.

FIGS. 2A–2B illustrate another integrated circuit system 20 that utilizes a serial cascaded arrangement of master and slave CAM devices 22$a$–22$c$ to perform the functions of a lookup engine. Each CAM device is illustrated as having five ports: IN1, IN2, OUT1, OUT2 and OUT3. Input logic is provided between the first input port IN1 and the first output port OUT1. This input logic may be responsible for inspecting and/or altering instructions and/or decomposing instructions into multiple subordinate instructions to be performed by one or more slave CAM devices. The master CAM device 22$a$ is responsible for, inspecting/interpreting and scheduling the instructions the NPU issues to the lookup engine. For example, the master CAM device 22$a$ may hold information that is used to translate an indirect address to an absolute address when executing instructions, including read and write instructions. The absolute address is transferred from the master CAM device 22$a$ to the slave CAM devices 22$b$ and 22$c$ in combination with an instruction Additional cascaded arrangements of CAM devices are illustrated in FIG. 1 of U.S. Pat. No. 6,148,364, FIG. 13 of U.S. Pat. No. 6,240,485 and in U.S. Pat. Nos. 6,137,350, 6,490,650 and 6,493,793. In FIG. 1 of the '364 patent, an instruction bus IBUS is connected to two depth cascaded CAM devices. The '485 patent describes a method and apparatus for implementing a learn instruction in a depth cascaded CAM system.

SUMMARY OF THE INVENTION

Content addressable memory (CAM) devices according to embodiments of the present invention include CAM logic that is configured to pass an instruction received at an instruction input port to an instruction output port without inspection or alteration. This enables the CAM devices to be operated efficiently as equivalent devices within a cascaded chain of CAM devices that collectively form multiple databases within a lookup engine having distributed CAM control. This CAM logic may include an input instruction register that is configured to latch the instruction received at the instruction input port and an output instruction register that is configured to latch the instruction received from the input instruction register. This CAM logic may also include an instruction FIFO that is configured to buffer instructions received from the input instruction register.

Further embodiments of the present invention include methods of operating a cascaded chain of CAM devices. These methods may include performing a learn operation in the cascaded chain of CAM devices by sequentially passing a learn instruction through a plurality of CAM devices in the cascaded chain, without inspection or alteration. In the event the plurality of CAM devices are configured to include next free address (NFA) tables therein, then the performing step may include writing a search key into a CAM core within a selected one of the plurality of CAM devices, in response to evaluating whether an NFA table in the selected one of the plurality of CAM devices has a valid NFA address for the search key. This performing step may also include evaluating each of the NFA tables in the plurality of CAM devices to determine whether a valid NFA address for the search key is present. In particular, the step of evaluating each of the NFA tables in the plurality of CAM devices may be performed as an operation that starts first in a highest priority CAM device and starts last in a lowest priority CAM device, with the starting times being offset by the number of cycles of latency associated with each CAM device.

Additional methods of operating a cascaded chain of CAM devices may include performing a learn operation in the cascaded chain of CAM devices by writing a search key associated with a database into a selected one of the cascaded chain of CAM devices, in response to evaluating whether an NFA table in the selected one of the cascaded chain of CAM devices has a valid NFA address for the search key, and then searching each of the CAM devices in the cascaded chain to identify an address of a highest priority invalid entry in a CAM device that retains the database. The address of this highest priority invalid entry is then written into an NFA table within the CAM device containing the highest priority invalid entry.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)).

Figure 3A:
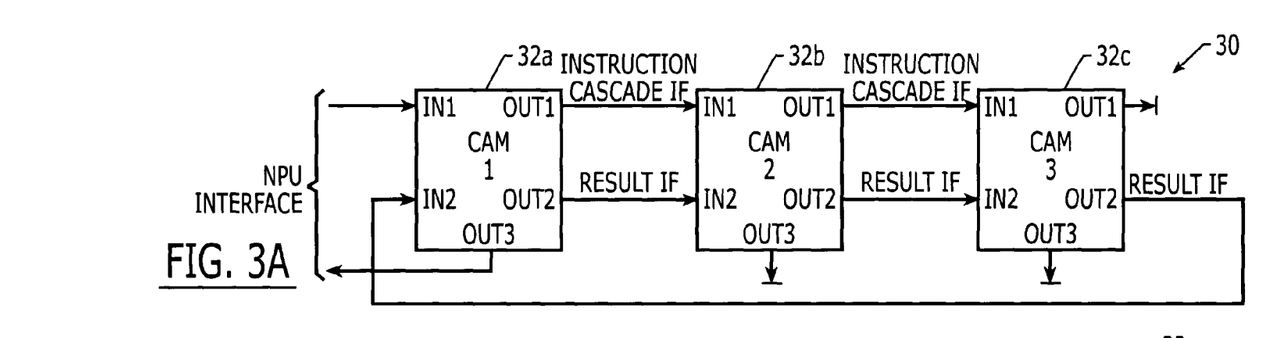
FIG. 3A is a block diagram of a cascaded arrangement of CAM devices that utilizes a distributed control architecture, according to an embodiment of the present invention.

Referring now to FIGS. 3A–3D, an integrated circuit system will be described that utilizes content addressable memory (CAM) devices within a lookup engine. As illustrated by FIG. 3A, this system includes a cascaded arrangement of CAM devices 30 that is configured to communicate with a network processing unit (NPU) via a network interface bus. The cascaded arrangement of CAM devices 30 is shown as including three (3) CAM devices 32a, 32b and 32c, which may be mounted as separate integrated circuit chips on a printed circuit board (not shown). The CAM devices may be arranged according to priority, with the first CAM device 32a having the highest physical priority and the third CAM device 32c having the lowest physical priority. In a typical lookup engine, sixteen (16) or more CAM devices may be provided in a cascaded arrangement. Other priority arrangements and numbers of devices may also be possible.

The CAM devices 32a, 32b and 32c are shown as having five ports (IN1, IN2, OUT1, OUT2 and OUT3), however, CAM devices having more or less ports may be used. The ports IN1 and OUT3 associated with the first CAM device 32a communicate with a network processing unit (NPU) via an NPU interface bus. The output ports OUT1 and OUT2 of the first CAM device 32a pass instructions and results onto an instruction cascade interface bus (Instruction Cascade IF) and a result interface bus (Result IF), as illustrated. The result interface bus may include a signal line that passes a hit signal (HIT) from an "upstream" CAM device having higher priority to a "downstream" CAM device having lower priority. The second CAM device 32b receives instructions at its first input port IN1 and passes these instructions to its first output port OUT1. The second CAM device 32b also receives upstream results at its second input port IN2 and generates results at its second output port OUT2. The third output ports OUT3 of the second and third CAM devices 32b and 32c are not used in the illustrated embodiment. The third CAM device 32c receives instructions at its first input port IN1, however, because it is the last CAM device within the cascaded chain, the first output port OUT1 is not used to pass instructions downstream. The third CAM device 32b also receives upstream results at its second input port IN2 and generates final results at its second output port OUT2.

The final results (Result IF) are passed to the second input port IN2 of the first CAM device 32a. The third output port OUT3 is not used. As described more fully hereinbelow, the CAM devices 32a, 32b and 32c provide a multi-cycle delay to instructions received at the first input port IN1, and pass these instructions to the first output port OUT1 without inspection or alteration.

Figure 3B:
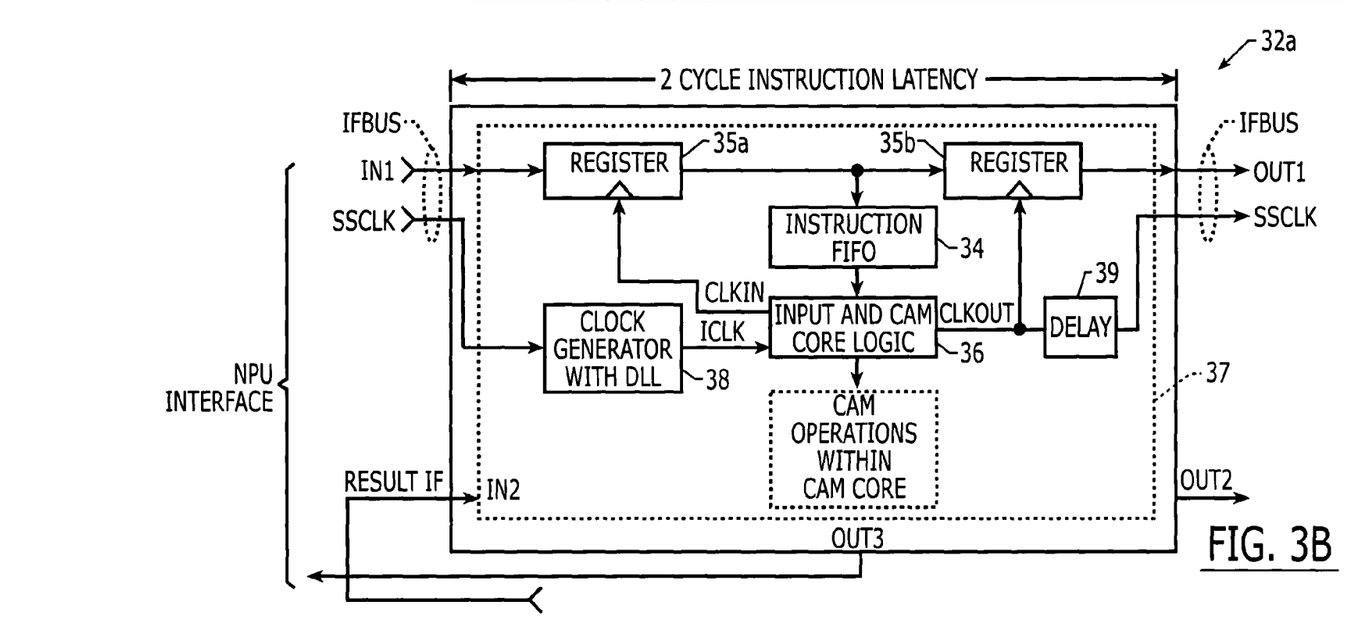
FIG. 3B is a block diagram of a CAM device used in FIG. 3A.

As illustrated by FIG. 3B, the first CAM device 32a including CAM logic 37. One of the functions of this CAM logic is to provide a two cycle latency to received instructions, but otherwise leave the instructions intact. A first cycle of latency is typically incurred when the received instruction passes into the first input port (IN1) and is latched into an input register 35a and a second cycle of latency is incurred when the latched instruction is passed to an output register 35b and reproduced at the first output port OUT1. These operations may also apply to segments of an instruction word in the event the first input port IN1 and first output port OUT1 are narrower than the width of the instruction word. In other embodiments, a latency less than or greater than two cycles may be present between the receipt of an instruction at the first input port IN1 and the passing of the same instruction to the first output port OUT1. The input and output registers 35a and 35b are illustrated as being responsive to input and output clock signals (CLKIN and CLKOUT). These clock signals may be generated internally by input and CAM core logic 36. This logic 36, which is responsible for controlling CAM operations within a CAM core, may be synchronized to an internal clock signal (ICLK) that is generated by a clock generator 38. This clock generator 38 may include a delay locked loop (DLL) that operates to synchronize internal clock signals with an external clock signal. This external clock is illustrated as a "source synchronous" clock (SSCLK) that may accompany incoming data. An output SSCLK may be generated by a delay device 39 that receives the output clock signal CLKOUT. The input and CAM core logic 36 may be of conventional design and need not be described more fully herein.

In some preferred embodiments, an instruction FIFO 34 is provided to maintain a queue of pending instructions and to provide these instructions in a first-in first-out sequence to the logic 36. For example, in the event the network processing unit (NPU), not shown, is capable of handling multiple contexts (e.g., 128 independent contexts), the instructions issued by these various contexts may be maintained in the instruction FIFO 34 within each CAM device in the cascaded chain. If each CAM device provides a two cycle instruction latency, then the offset between the queue of instructions within first and Nth CAM devices in a cascaded chain will equal 2(N−1) cycles.

The CAM devices within the cascaded chain are configured to operate in a system that supports a distributed CAM control architecture. In this architecture, indirect information, including next free address (NFA) table information, is distributed to all of the CAM devices in the chain and all of the CAM devices decode instructions in the same manner, albeit typically delayed by an integer multiple of two or more cycles. Thus, it is not necessary to program the first CAM device in the chain (i.e., the highest priority CAM device) to operate as a master CAM device and the other CAM devices to operate as slave devices, as described above with respect to FIG. 2A.

Figure 3C:
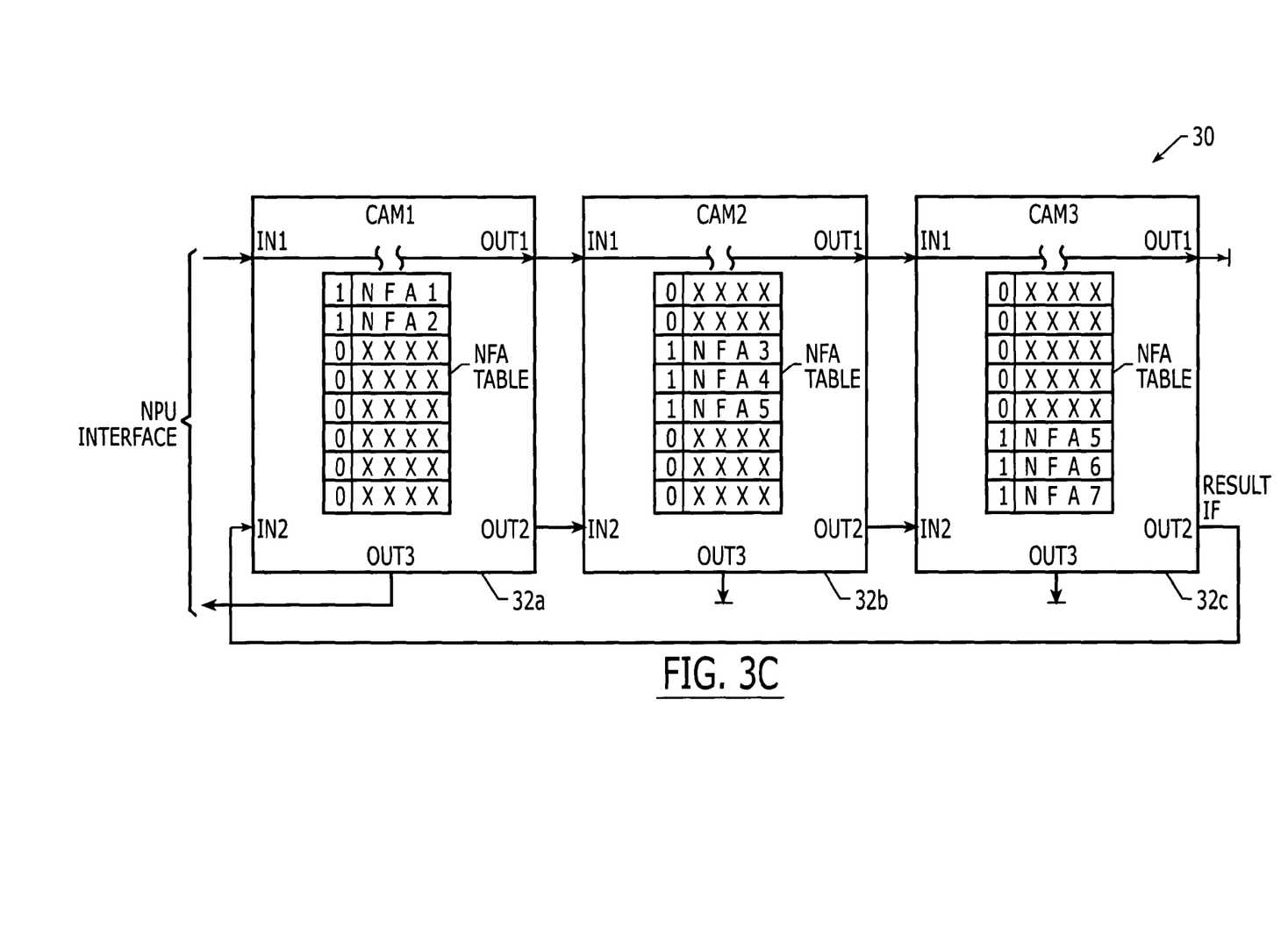
FIG. 3C is a block diagram of a cascaded arrangement of CAM devices that utilizes the distributed control architecture of FIG. 3A, with each CAM device having a next free address (NFA) table therein.

FIG. 3C provides a further illustration of the cascaded arrangement of CAM devices 30 of FIG. 3A, having next free address (NFA) tables therein. For sake of clarity, other elements of the CAM devices have been omitted. The NFA table within the first CAM device 32a identifies two valid next free addresses (NFA1 and NFA2) associated with first and second databases (DB1 and DB2). The address values "XXXX" represent "don't care" values associated with databases that are present in other CAM devices (this condition is identified by a valid bit that has been set to an inactive level (e.g., binary 0). The NFA table within the second CAM device 32b identifies three valid next free addresses (NFA3, NFA4 and NFA5) associated with third, fourth and fifth databases. Finally, the NFA table within the third CAM device 32c identifies three valid next free addresses (NFA6, NFA7 and NFA8) associated with sixth, seventh and eighth databases. As will be understood by those skilled in the art, a database may represent one or more CAM array blocks (or sector(s)) that span one or more CAM devices, within each block including a plurality of consecutive CAM entries.

Figure 3D:
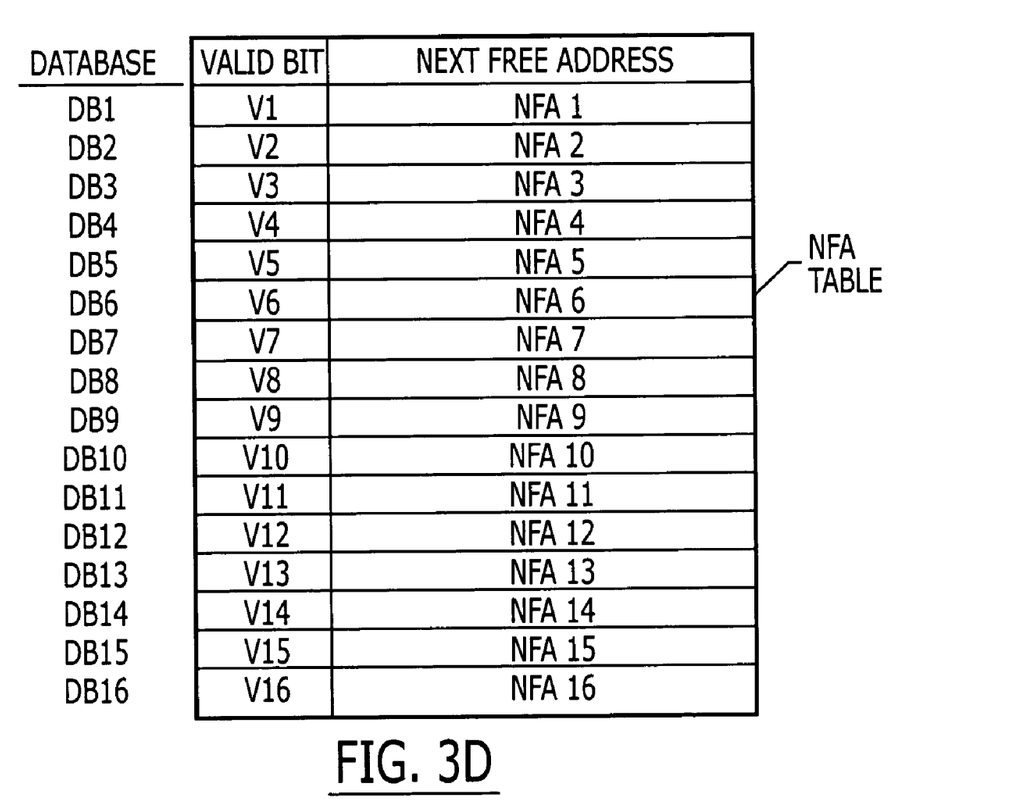
FIG. 3D is an illustration of a next free address (NFA) table, which retains valid bit data and address data associated with one or more databases within a CAM core of a CAM device.

FIG. 3D illustrates an NFA table that may be utilized in a CAM device 30 that is capable of supporting as many as sixteen databases. When utilized within a cascaded chain of CAM devices, a single database may span two or more CAM devices. Thus, it is not impossible for an NFA table within a CAM device to have no valid NFA values (i.e., all valid bits V1, V2, . . . , V16=0). The NFA table illustrated by FIG. 3D is reproduced in FIGS. 4A–4B.

Figure 4A:
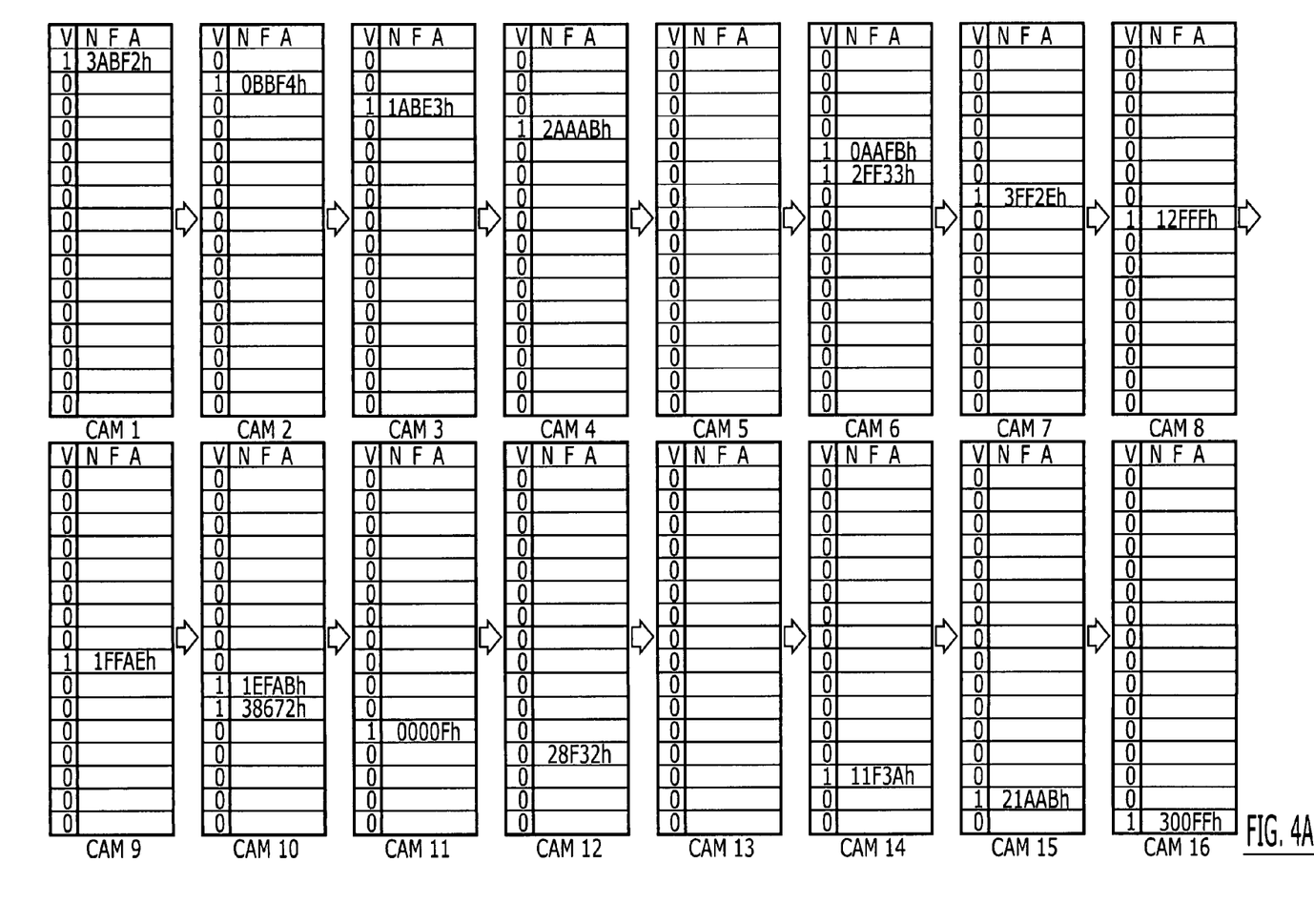
FIGS. 4A–4B illustrate sixteen NFA tables associated with sixteen CAM devices that are connected in a cascaded arrangement and support distributed control. The entries in the NFA tables of FIG. 4B have been updated to reflect the performance of three learn instructions into databases 1, 4 and 14.
Figure 4B:
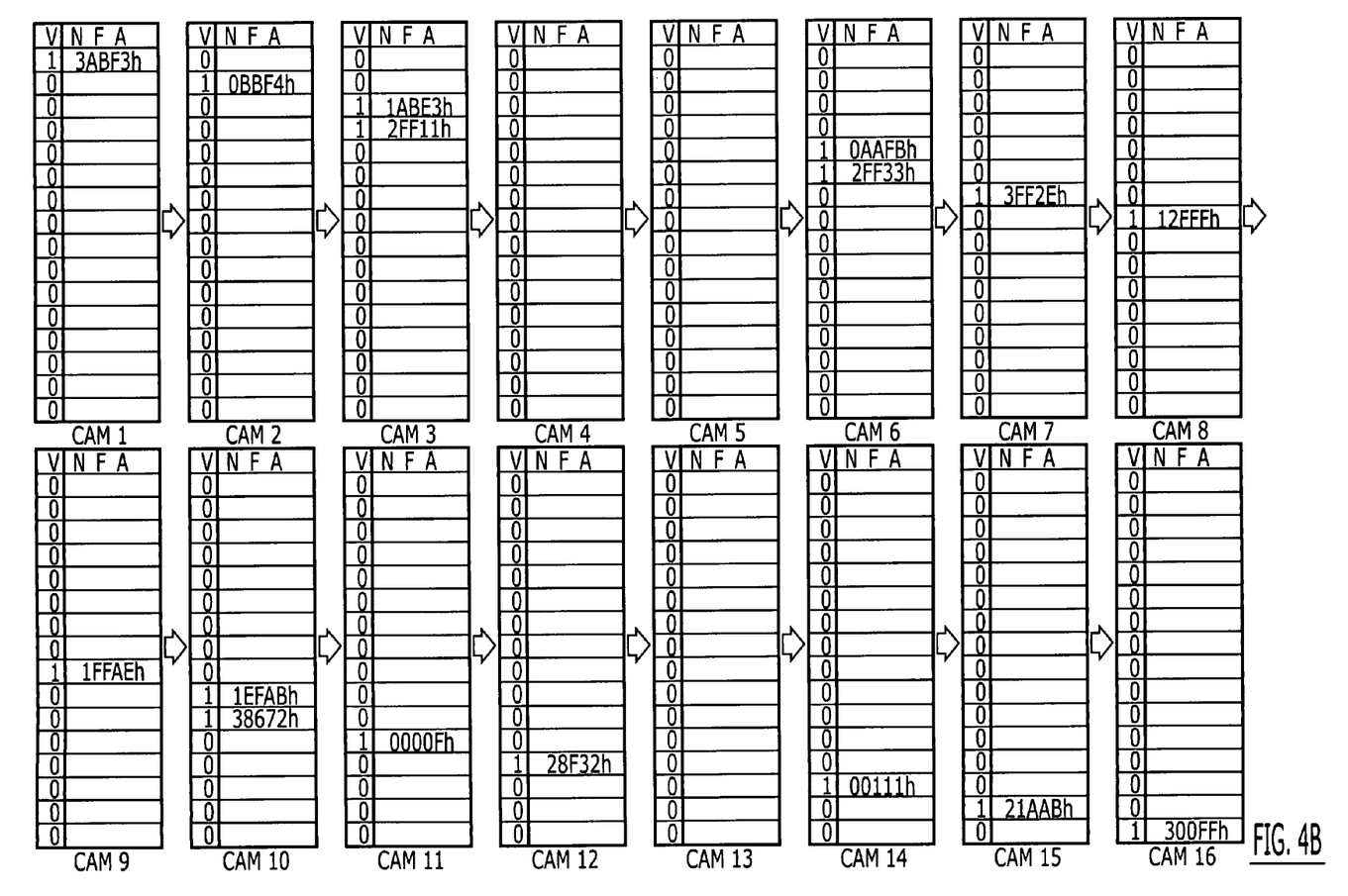

In particular, FIGS. 4A–4B illustrate hypothetical "before" and "after" snapshots of valid entries within sixteen NFA tables that are contained within a cascaded chain of sixteen CAM devices that has received three learn instructions. The CAM devices are treated herein as having $2^{18}$ entries which span an address space of 00000h to 3FFFFh. As will be understood by those skilled in the art, this address space may be defined by a CAM core having 128 CAM array blocks with 2048 entries/block. The entries within a CAM array block may include three searchable fields: a valid bit field (e.g., 1 bit), a database field (e.g., 4 bits) and a data field (e.g., 72 bits). Other searchable and/or non-searchable fields may also be provided.

A learn instruction may be issued by a network processing unit (NPU) when a previously issued search instruction concludes with an absence of any valid hits within the cascaded chain of CAM devices. A learn instruction is internally decoded into two consecutive operations within each of the CAM devices. These operations are a "WRITE" operation, which writes a "new" search key into a specified database, followed by a "SEARCH" operation to identify an new next free address for that specified database. During the WRITE operation, each CAM device performs a preliminary operation(s) to check its NFA table to see whether a valid next free address is available within the specified database. Only one next free address is possible amongst the sixteen CAM devices. If a valid next free address is available, then the new search key to be learned is written into the CAM device at an address specified in the corresponding NFA table. The valid bit of the CAM entry receiving the new search key is also set to an active level so that the entry is available for searching whenever the next search instruction is issued by the NPU. Because a two-cycle latency may be present between each CAM device in the chain, the highest priority CAM device, which is the first in the chain, performs its learn operations first and all other CAM devices start their learn operations in sequence.

The SEARCH operation associated with a learn instruction is also performed within each CAM device in the chain. This operation involves looking for the next free entry for the specified database and returning the address of the next free entry to the corresponding NFA table. To perform this search operation, a special search key may be used that has its valid bit field set to 0, its database field set to the corresponding database that was just updated with the new search key and its data field globally masked. This search operation may result in multiple hits within the same CAM device and even across two or more CAM devices. Each of the hits represents a matching entry having an invalid status within the specified database. However, only the highest priority matching entry within the highest priority CAM device is selected when updating the NFA table. The entry address (e.g., CAM array block address+row address) of the highest priority matching entry is written into the NFA table and the corresponding valid bit within the NFA table is set to indicate a valid next free address. As will be understood by those skilled in the art, the earlier generation of a HIT signal by an upstream CAM device can be used to disable further processing of HIT signals (and NFA table updates) within all downstream CAM devices.

These learn operations are further illustrated by FIGS. 4A–4B. In FIG. 4A, the sixteen NFA tables identify hypothetical CAM core entry addresses for the next free entries within sixteen databases. These next free addresses are illustrated by TABLE 1.

TABLE 1

| DATABASE | NEXT FREE ADDRESS | ADDRESS AFTER LEARN |
|---|---|---|
| 1 | 3ABF2h - CAM1 | 3ABF3h (moved down in CAM1) |
| 2 | 0BBF4h - CAM2 | NC |
| 3 | 1ABE3h - CAM3 | NC |
| 4 | 2AAABh - CAM4 | 2FF11h (moved up to CAM3) |
| 5 | 0AAFBh - CAM6 | NC |
| 6 | 2FF33h - CAM6 | NC |
| 7 | 3FF2Eh - CAM7 | NC |
| 8 | 12FFFh - CAM8 | NC |
| 9 | 1FFAEh - CAM9 | NC |
| 10 | 1EFABh - CAM10 | NC |
| 11 | 38672h - CAM10 | NC |
| 12 | 0000Fh - CAM11 | NC |
| 13 | 28F32h - CAM12 | NC |
| 14 | 11F3Ah - CAM14 | 00111h (moved up in CAM14) |
| 15 | 21AABh - CAM15 | NC |
| 16 | 300FFh - CAM16 | NC |

FIG. 4B illustrates how the next free addresses are updated within three tables in response to three learn operations LEARN 1, LEARN 2 and LEARN 3 associated with databases 1, 4 and 14, respectively. With respect to the first database, the next free address 3ABF2h in FIG. 4A is updated to reflect a new next free address as 3ABF3h once a write operation has been performed to add one valid entry to the first database within the first CAM device (CAM1). This is illustrated in the rightmost column of TABLE 1. With respect to the fourth database, the next free address 2AAABh in FIG. 4A is updated to reflect a new next free address as 2FF11h (in CAM 3) once a write operation has been performed to add one valid entry to the fourth database within the fourth CAM device (CAM4). Finally, with respect to the fourteenth database, the next free address 11F3Ah in FIG. 4A is updated to reflect a new next free address as 00111h once a write operation has been performed to add one valid entry to the fourteenth database within the fourteenth CAM device (CAM4).

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A content addressable memory (CAM) device, comprising:
 CAM logic that is configured to pass an instruction received at an instruction input port to an instruction output port without inspection or alteration so that the CAM device may be operated within a cascaded chain of CAM devices that collectively form multiple databases within a lookup engine.

2. The CAM device of claim 1, wherein said CAM logic comprises:
 an input instruction register that is configured to latch the instruction received at the instruction input port; and
 an output instruction register that is configured to latch the instruction received from the input instruction register.

3. The CAM device of claim 2, wherein said CAM logic further comprises an instruction FIFO that is configured to buffer instructions received from the input instruction register.

4. An integrated circuit system, comprising:
 a cascaded chain of CAM devices that is configured to support passing of instructions down the cascaded chain without inspection or alteration using a distributed control architecture.

5. The system of claim 4, wherein the CAM devices in said cascaded chain are arranged in a high-to-low CAM priority sequence.

6. The system of claim 5, wherein each of the CAM devices in said cascaded chain comprises:
 an instruction input port that is configured to receive a learn instruction from a first instruction cascade interface bus during a first cycle of an instruction operation; and
 an instruction output port that is configured to reproduce the learn instruction on a second instruction cascade interface bus during a second cycle of the instruction operation that is delayed relative to the first cycle.

7. The system of claim 4, wherein each of the CAM devices in said cascaded chain comprises:
 an instruction input port that is configured to receive an instruction from a first instruction cascade interface bus during a first cycle of an instruction operation; and
 an instruction output port that is configured to reproduce the instruction on a second instruction cascade interface bus during a second cycle of the instruction operation that is delayed relative to the first cycle.

8. The system of claim 4, wherein each of the CAM devices in said cascaded chain comprises:
 an instruction input port that is configured to receive an instruction from a first instruction cascade interface bus, in-sync with a first cycle of a clock signal generated internal to the respective CAM device; and
 an instruction output port that is configured to reproduce the instruction on a second instruction cascade interface bus, in-sync with a second cycle of the clock signal that is delayed relative to the first cycle of the clock signal.

9. A content addressable memory (CAM) device, comprising:
 an instruction input port that is configured to receive an instruction from a first instruction cascade interface bus, in-sync with a first clock signal generated internal to the CAM device; and
 an instruction output port that is configured to reproduce the instruction without inspection or alteration on a second instruction cascade interface bus, in-sync with a second clock signal generated internal to the CAM device.

10. The CAM device of claim 9, wherein said instruction input port comprises an input register that is responsive to the first clock signal; and wherein said instruction output port comprises an output register that is responsive to the second clock signal.

11. The CAM device of claim 10, further comprising an instruction FIFO that is electrically coupled to received instructions from the input register.

12. A method of operating a cascaded chain of CAM devices arranged in a high-to-low priority sequence, comprising the step of:
performing a learn operation in the cascaded chain of CAM devices by passing a learn instruction through a plurality of CAM devices in the cascaded chain, without inspection or alteration, using a distributed control architecture that offsets timing of learn operations within each of the plurality of CAM devices.

13. The method of claim 12, wherein each of the plurality of CAM devices includes a next free address (NFA) table; and wherein said performing step further comprises the step of:
writing a search key into a CAM core within a selected one of the plurality of CAM devices, in response to evaluating whether an NFA table in the selected one of the plurality of CAM devices has a valid NFA address for the search key.

14. The method of claim 13, wherein said performing step further comprises evaluating each of the NFA tables in the plurality of CAM devices to determine whether a valid NFA address for the search key is present.

15. The method of claim 14, wherein the step of evaluating each of the NFA tables in the plurality of CAM devices is performed as a sequential operation that follows the high-to-low priority sequence.

16. The method of claim 15, wherein the search key is associated with a CAM core database; and wherein said writing step is followed by the step of searching each of the plurality of CAM devices to identify an address of a highest priority invalid entry within the CAM core database.

17. The method of claim 16, wherein said step of searching each of the plurality of CAM devices to identify an address is followed by the step of writing the address into the NFA table.

18. The method of claim 13, wherein the search key is associated with a CAM core database; and wherein said writing step is followed by the step of searching each of the plurality of CAM devices to identify an address of a highest priority invalid entry within the CAM core database.

19. The method of claim 18, wherein said step of searching each of the plurality of CAM devices to identify an address is followed by the step of writing the address into the NFA table.

20. A method of operating a cascaded chain of CAM devices, comprising the step of:
performing a learn operation in the cascaded chain of CAM devices by:
writing a search key associated with a database into a selected one of the cascaded chain of CAM devices, in response to evaluating whether an NFA table in the selected one of the cascaded chain of CAM devices has a valid NFA address for the search key; and
searching each of the CAM devices in the cascaded chain to identify an address of a highest priority invalid entry in a CAM device that retains the at least a portion of the database.

21. A content addressable memory (CAM) device, comprising:
CAM logic that is configured to pass a learn instruction received at an instruction input port to an instruction output port without inspection or alteration and with at least one cycle of latency.

22. The CAM device of claim 21, wherein said CAM logic comprises:
an input instruction register that is configured to latch the learn instruction received at the instruction input port; and
an output instruction register that is configured to latch the learn instruction received from the input instruction register.

23. The CAM device of claim 22, wherein said CAM logic further comprises an instruction FIFO that is configured to buffer learn instructions received from the input instruction register.

* * * * *